(12) United States Patent
Andresen et al.

(10) Patent No.: US 8,614,865 B2
(45) Date of Patent: Dec. 24, 2013

(54) CIRCUIT ARRANGEMENT

(75) Inventors: Stefan Andresen, Reichelsheim (DE); Jean Schuetz, Neulussheim (DE)

(73) Assignee: Voltwerk Electronics GmbH, Hamburg (DE)

( * ) Notice: Subject to any disclaimer, the term of this patent is extended or adjusted under 35 U.S.C. 154(b) by 325 days.

(21) Appl. No.: 12/773,726

(22) Filed: May 4, 2010

(65) Prior Publication Data

US 2011/0090610 A1    Apr. 21, 2011

(30) Foreign Application Priority Data

May 4, 2009   (DE) .................. 10 2009 019 831

(51) Int. Cl.
*H02H 3/00*    (2006.01)
*H02H 7/00*    (2006.01)

(52) U.S. Cl.
USPC .............................................. 361/3

(58) Field of Classification Search
USPC ...................................... 361/2–13
See application file for complete search history.

(56) References Cited

U.S. PATENT DOCUMENTS 5,712,572 A * 1/1998 Tamechika et al. ......... 324/551
5,726,505 A * 3/1998 Yamada et al. ............. 307/127

FOREIGN PATENT DOCUMENTS

| DE | 76 02 660 U1 | 7/1976 |
| DE | 197 45 074 A1 | 4/1999 |
| DE | 10 2005 018 173 A1 | 10/2006 |
| DE | 10 2005 061 532 B4 | 7/2007 |
| EP | 1 657 797 A1 | 5/2006 |
| EP | 2 037 559 A2 | 3/2009 |
| EP | 2 061 052 A2 | 5/2009 |
| JP | 05284654 A * | 10/1993 |

OTHER PUBLICATIONS

Abstract for JP 05284654. Oct. 29, 1993.*
European Search Report for Application No. 10 161 909.6, mailed Oct. 5, 2010, 6 pages.

* cited by examiner

*Primary Examiner* — Rexford Barnie
*Assistant Examiner* — Christopher Clark
(74) *Attorney, Agent, or Firm* — Kilpatrick Townsend & Stockton LLP

(57) ABSTRACT

The present invention concerns a circuit arrangement (1) for electrically coupling a direct-current source (2) to a direct-current load, including a first and a second current input node (11, 12) for receiving a direct current generated by the direct-current source, a first and a second current output node (21, 22) for the delivery of the generated direct current to the direct-current load, an isolating means (4) connected between the first current input node (11) and the first current output node (21) and/or the second current input node (12) and the second current output node (22) for interrupting the electrical connection between the respective nodes, and an auxiliary switching means (14) connected between the first current input node (11) and the second current input node (12) for short-circuiting of the first and second current input nodes (11, 12).

9 Claims, 1 Drawing Sheet

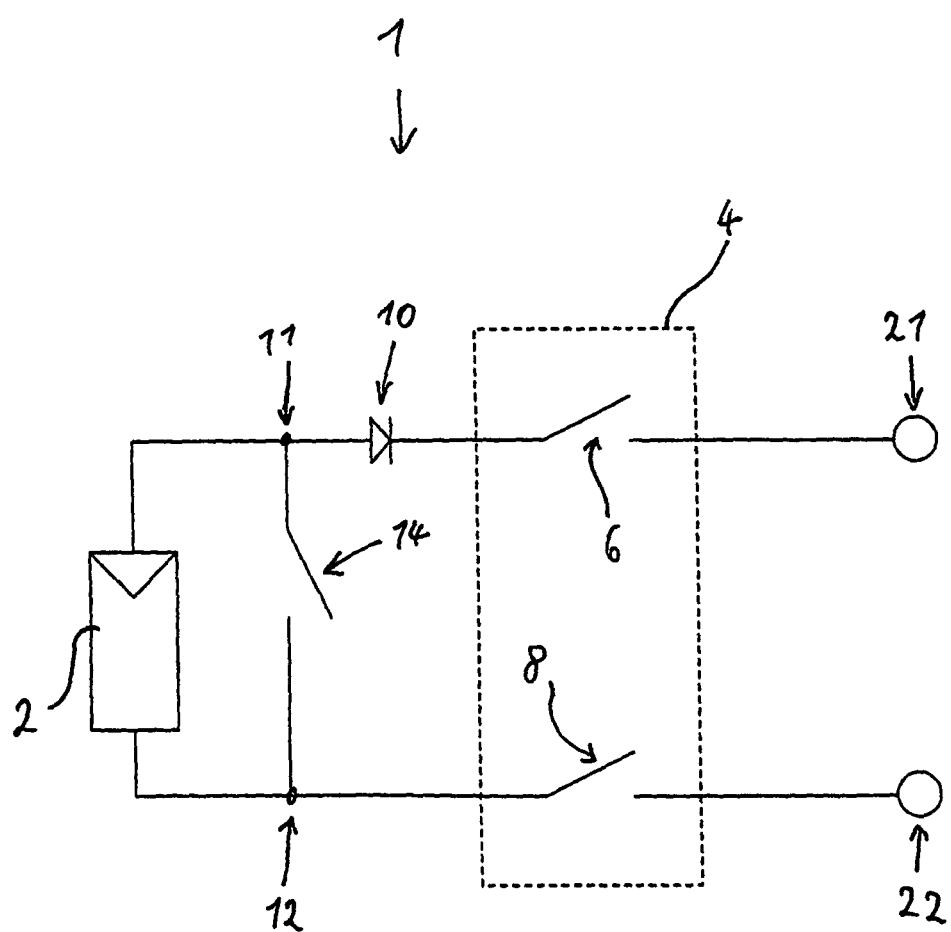

CIRCUIT ARRANGEMENT

CROSS-REFERENCE TO RELATED APPLICATIONS

This application is a National Stage of German Patent Application No. 10 2009 019 831.8 filed May 4, 2009, the contents of which are incorporated herein by reference in their entirety.

BACKGROUND

The present invention concerns a circuit arrangement for electrically coupling a direct-current source to a direct-current load and a method of interrupting a direct-current connection between an output of a direct-current source and an input of a direct-current load. The invention further concerns the use of an isolating switch for interrupting a direct-current connection.

Solar generators generate a direct current which is transmitted to a connected load. In that case the solar generators generate current as soon as a load is connected and can receive current and there is sufficient incident solar radiation. It is therefore necessary to provide a circuit-breaker device which in a fault situation can separate the solar generator from the load.

Various solutions are known from the state of the art, which are based on DC switches or circuit arrangements for power reduction by way of pulsed semiconductors. EP 1 657 797 discloses for example a circuit arrangement with solar generators and connected inverter which in a fault situation, when the inverter is to be separated from the solar generator, progressively interrupts the circuit from the solar generator to the inverter and back by means of a clock module and thereby puts the solar generator into an idle no-load condition. As soon as that no-load condition has occurred current no longer flows between the solar generator and the inverter and the connection can be separated.

A disadvantage in that respect is the comparatively great and complicated involvement in preparing for such a circuit-breaking situation. In addition the entire current must also flow by way of the clock module in normal operation, that is to say the predominant part of the time. That gives rise in particular to heat losses in the clock module.

BRIEF DESCRIPTION OF THE DRAWINGS

FIG. 1 illustrates a circuit arrangement according to embodiments of the present invention.

DETAILED DESCRIPTION

The object of the invention is therefore as much as possible reducing or eliminating at least one of the above-specified problems. In particular the invention seeks to provide a simplified circuit arrangement and/or a circuit arrangement involving fewer losses in ongoing operation and/or at least one alternative circuit arrangement.

According to the invention there is proposed a circuit arrangement as set forth in claim 1.

The circuit arrangement according to the invention is prepared for coupling an electrical direct-current source to a direct-current load. There are provided two current input nodes, at which the direct current generated by the direct-current source is inputted. In that respect the term inputting a current is used to denote a positive current at a positive voltage, for example at the first current input node, and a negative current at a negative voltage at the second current input node. A positive and a negative voltage basically refers respectively to a mean voltage between the voltage potential of the first current input node and the voltage potential of the second current input node.

In addition there are provided two current output nodes for the delivery of the direct current generated by the direct-current source to the direct-current load. In operation therefore the current generated flows substantially from the direct-current source to the direct current load, namely from the direct-current source with a positive voltage to the first current input node, from there to the first current output node and further to the direct-current load. From the direct-current load the current flows with a negative voltage to the second current output node and further to the second current input node and finally back to the direct-current source to form a closed circuit.

In addition there is provided an isolating means for separating the electrical circuit. The isolating means is connected between the current input and current output nodes. In that respect a connection can be made between the first current input node and the first current output node or also between the second current input node and the second current output node. Likewise the isolating means can be provided for in particular simultaneously effecting both of the above-mentioned isolation procedures.

Connected between the first current input node and the second current input node is an auxiliary switching means for short-circuiting the first and second current input nodes. If that auxiliary switching means is closed for short-circuiting purposes the direct-current source is thus short-circuited. That can provide that the current to the load falls to zero. The direct-current source admittedly still generates direct current, but because of the short-circuit it no longer flows to the load or at best flows thereto in very small amounts.

The isolating means can now open to interrupt an electrical connection between the first current input node and the first current output node, or the second current input node and the second current output node. Accordingly the known problem does not arise in regard to the isolating means, of also interrupting an in particular high direct current. Rather it can switch in the current-less condition. Accordingly it is possible to use an inexpensive isolating means which does not need to be suitable for switching under load.

Preferably the direct-current source forms a part of the circuit arrangement. Preferably a solar generator is used as the direct-current source for generating the electrical direct current and inputting it at the current input nodes. A solar generator, that is to say in particular an array of photovoltaic cells, generates a direct current as soon as there is sufficient solar radiation and a load is connected. In that respect a solar generator is usually short-circuit-resistant and in accordance with the invention can thus be short-circuited by the auxiliary switching means.

Preferably the electrical direct-current load forms a part of the circuit arrangement. Preferably an inverter is used as the direct-current load, for converting the direct current into an alternating current for the feed into an electrical alternating current network. Thus a solar generator can be advantageously separably coupled to an inverter and in addition to an electrical alternating current network in order to feed the electrical energy or a large part of the electrical energy generated in the solar generator in the form of direct current into an electrical alternating current network by way of the inverter. If for example it should be necessary to separate the direct-current load from the solar generator because of a fault, then firstly the auxiliary switch is closed and the direct current generated by the solar generator will flow in the form of a short-circuit current and thus will not reach the direct-current consumer or at most in minimal portions thereof. A connection between the solar generator and the load, in particular the inverter, can now basically be separated in a load-free condition.

Preferably the isolating means used is an isolating switch, in particular an AC isolating switch. The term isolating switch is used to denote a component which separates the electrical circuit at a low current or even in the current-less condition. In this connection the reference to a low current is used to denote a current which is at least less and in particular substantially less than the nominal current of the circuit at the location in question. In that respect when using a solar generator the nominal current of the solar generator can form the underlying basis.

An AC isolating switch is provided for an AC voltage application for isolation of the alternating current. When switching an alternating current the problem of an arc possibly does not occur.

When circuits are isolated under load, an arc occurs in the switch upon isolation. Extinction of the arc is the main problem of the on-load switch. Suitable technical measures are taken in relation thereto, depending on the respective switching capability. The nominal switching-on capability and the nominal switching-off capability is approximately at double the nominal current in the case of on-load switches. The typical nominal current can be up to 100 A or even higher. In particular nominal currents can be in the range of between 10 A and 100 A and in particular in the range of 20 A and 100 A. Accordingly it is only necessary to provide an inexpensive isolating switch, in particular an AC isolating switch, due to the short-circuiting of the solar generator—or other direct-current source—. It is possible to avoid an expensive, complicated on-load switch which is matched to the respective nominal current.

Preferably the auxiliary switching means includes at least one semiconductor switch, in particular an IGBT, a thyristor or a MOSFET. Preferably the auxiliary switching means is a semiconductor switch, in particular an IGBG, a thyristor or a MOSFET. Such semiconductor switches can be switched quickly, electronically and thus basically in a simple fashion if there is a suitable electronic actuating system. A fundamental disadvantage of a semiconductor switch could be the occurrence of power loss at the semiconductor switch. According to the invention however the auxiliary switching means or the semiconductor switch is open during normal operation. In that condition no power loss or no power loss worth mentioning is dropped at the semiconductor switch. The power loss occurring can be tolerated for the conditions in which the semiconductor switch is closed and which are to be kept as short as possible.

If in a fault situation the auxiliary switching means is closed and the connection between the solar generator and the inverter—or the direct-current source and the direct-current load—is interrupted, the auxiliary switching means can be opened again to put the solar generator from the short-circuited condition into the no-load condition. Opening of a semiconductor switch under current by interrupting the current is basically possible. It will be appreciated that problems with an arc cannot occur in the case of semiconductor switches. When using a thyristor that would admittedly have to be deliberately extinguished, but circuitry and actuating variants have generally long been known for that purpose.

Preferably a rectifying means, in particular a diode, is arranged at least between a current input node and a current output node. The diode is so directed that the current generated by the direct-current source flows therethrough, namely from the direct-current source to the direct-current load with a positive voltage or from the direct-current load to the direct-current source with a negative voltage. That provides that when the auxiliary switching means is closed the direction of the current cannot reverse and the direct-current load does not suddenly become the direct-current source and deliver energy again. In particular that can be a problem when using an inverter with a DC voltage intermediate circuit. When the auxiliary switching means is closed the DC voltage intermediate circuit, in particular also DC voltage intermediate circuit capacitors present there, could be short-circuited. That would lead to considerable reverse currents. That is prevented by the use of the rectifying means, in particular the diode.

To reduce losses due to that rectifying means, in particular the diode, in operation, there can be provided one or more semiconductor switches connected in parallel with the rectifying means. They can be closed in normal operation and thereby relieve the load on the rectifying means. In the fault situation they can be opened before the auxiliary switching means is closed or approximately at the same time therewith. Opening of such semiconductor switches connected in parallel with the rectifying means under load does not represent any problem worth mentioning because the current in question further flows through the rectifying means and is thus not interrupted by the aforesaid opening of the semiconductor switches.

In accordance with the invention there is also proposed a method of interrupting a direct-current connection between an output of a direct-current source and a input of a direct-current load, which includes the following steps in the following sequence:

Firstly the output of the direct-current source is short-circuited by means of an auxiliary switching means so that a short-circuit current flows at the output of the direct-current source and the direct-current connection to the load becomes current-less. Any minor currents can be disregarded.

Then the direct-current connection between the direct-current source such as for example a solar generator and the direct-current load such as for example an inverter is interrupted.

Finally in the next step the auxiliary switching means can be opened again to prevent a short-circuit current at the output of the direct-current source. In particular a loading on the auxiliary switching means by a continuous current is avoided thereby. Then, if desired, the direct-current source such as a solar generator can also be mechanically isolated from the direct-current load such as an inverter.

Preferably a method according to the invention is carried out with a circular arrangement according to the invention.

In accordance with the invention therefore an AC isolating switch provided for isolating an AC voltage connection or an alternating current connection can be used to interrupt a direct-current connection between a direct-current source and a direct-current load. That is made possible by the provision of an auxiliary switch for short-circuiting the output of the direct-current source.

Preferably an AC isolating switch is used for interrupting a direct-current connection in a circuit arrangement according to the invention, in particular in a circuit arrangement in which a solar generator is coupled to an inverter in such a way that the solar generator supplies the inverter with the direct current so that the inverter can provide an alternating current for the feed into an alternating current network.

The invention is described hereinafter by means of an embodiment by way of example with reference to the accompanying FIGURE:

FIG. 1 shows a circuit arrangement according to the invention with a solar generator.

The circuit arrangement 1 shown in FIG. 1 has a solar generator 2 and an isolating means 4. The solar generator 2 which here forms the direct-current source is electrically connected to the isolating means 4 by way of a first and a second current input node 11 and 12 respectively. There are provided a first and a second current output node 21 and 22 respectively for the connection of a direct-current load. The isolating means 4 has a first and a second isolating switch 6 and 8 respectively. The two isolating switches 6 and 8 are shown in the open condition and thus interrupt the connection between the first current input node 11 and the first current output node 21, or between the second current input node 12 and the second current output node 22.

In addition there is provided a rectifying means 10 having a forward direction such that a current is passed from the first current input node 11 to the first current output node 21 but is blocked in the opposite direction. In addition there is provided an auxiliary switching means 14 for electrically connecting the first current input node to the second current input node to be able to short-circuit the solar generator 2.

In operation, when therefore a direct-current load is connected to the first and second current output nodes 21, 22, the two isolating switches 6 and 8 are closed. The auxiliary switching means 14 is open. A current therefore flows from the solar generator 2 by way of the diode 10, the first isolating switch 6 to the first current output node 21 and thus to the direct-current load. From the direct-current load the current flows by way of the second current output node 22, the second isolating switch 8 and the second current input node 12 back to the solar generator 2.

According to the invention use is made of the property of a solar generator that the maximum current of the solar generator is limited to the short-circuit current which is usually only just above the nominal current.

Basically isolating switches can only be used when no voltage is applied across them at the switching time or no current flows through them.

The auxiliary switching means 14 shown in FIG. 1 which in an embodiment is in the form of a power switch guarantees that no current flows. When that auxiliary switching means 14 or the power switch closes the rectifying means 10 in the form of a diode is non-conducting when a voltage is still applied at the load. In the case of an inverter as the direct-current load it typically has an input capacitor which maintains the voltage. Basically now the complete current generated by the solar generator 2 flows by way of the auxiliary switching means 14 in the form of the power switch. The isolating means 4 which is in the form of an isolating switch can open in the currentless condition. The switching power is taken over by the power semiconductor or auxiliary switching means when the solar generator current is subsequently switched off.

It could be seen that the arrangement of FIG. 1 has the disadvantage that a serial diode, namely the diode or the rectifying means 10, is permanently in engagement in relation to the solar generator 2. The voltage drop at the diode 10 can however be reduced by parallel-connected MOS switches which are actuated substantially in inverse relationship with the auxiliary switching means 14 in the form of the power semiconductor.

The invention described herein is thus intended to contribute to a reduction in costs insofar as the use of isolating switches, in which respect it is also possible to use isolating switches from the AC field, is made possible instead of DC power switches.

Further features of the invention and in particular advantages are that no or a slight loading occurs in respect of the switching contacts of the isolating means upon being switched off. In addition inexpensive solutions are made possible by virtue of the fact that AC isolating switches can be used. From time to time a more compact structure is possible as no space is required for arc chambers and the like, for the isolating means. It is possible to reckon on low losses at most in the switched-on mode of operation as current only flows through the diode 10—based on the embodiment of FIG. 1.

The invention claimed is:

1. A circuit arrangement for electrically coupling a direct-current source to a direct-current load, including
   a first and a second current input node for receiving a direct current generated by the direct-current source,
   a first and a second current output node for the delivery of the generated direct current to the direct-current load,
   an AC isolating switch connected between the first current input node and the first current output node and/or the second current input node and the second current output node for interrupting the electrical connection between the respective nodes when the AC isolating switch is opened, and
   an auxiliary switch connected between the first current input node and the second current input node for short-circuiting of the first and second current input nodes prior to opening the AC isolating switch, wherein the short-circuiting diverts the direct-current away from the AC isolating switch so that the AC isolating switch is opened while in a low current state.

2. The circuit arrangement as set forth in claim 1 and further including:
   the direct-current source connected to the first and second current input nodes, wherein the direct-current source includes a solar generator, for generating and inputting an electrical current, and/or
   the direct-current load connected to the first and second current output nodes for receiving the generated direct current, wherein the direct-current load includes an inverter for converting the direct current into an alternating current for the feed into an electrical alternating current network.

3. The circuit arrangement as set forth in claim 1, wherein the auxiliary switch includes at least one semiconductor switch, or one of an IGBT, a thyristor, or a MOSFET switch.

4. The circuit arrangement as set forth in claim 1 further includes a rectifier arranged between the first current input node and the first current output node and/or between the second current input node and the second current output node, wherein the rectifier includes a diode, for passing the generated direct current and preventing a current reversal.

5. The circuit arrangement as set forth in claim 4, wherein the at least one semiconductor switch or the one of an IGBT, a thyristor, or a MOSFET switch is connected in parallel with the rectifier.

6. A method of interrupting a direct-current connection between an output of a direct-current source and an input of a direct-current load, the method comprising:
   short-circuiting the output of the direct-current source by an auxiliary switch so that a short-circuit current flows at the output of the direct-current source and the direct-current connection becomes current-less,
   while the short-circuit current is flowing, interrupting the direct-current connection by opening an AC isolating switch while the AC isolating switch is in a current-less state, and subsequent to opening the AC isolating switch, opening the auxiliary switch to interrupt the short-circuit current at the output of the direct-current source.

7. A method of interrupting a direct-current connection between an output of a direct-current source and an input of a direct-current load including the steps:
- short-circuiting the output of the direct-current source by an auxiliary switch so that a short-circuit current flows at the output of the direct-current source and the direct-current connection becomes current-less,
- while the short-circuit current is flowing, interrupting the direct-current connection by opening an AC isolating switch while the AC isolating switch is in a current-less state, and
- subsequent to opening the AC isolating switch, opening the auxiliary switch to interrupt the short-circuit current at the output of the direct-current source, wherein the circuit arrangement as set forth in claim 1 is used.

8. A method comprising:
- short-circuiting an output of a direct-current source so that a short-circuit current flows at the output of the direct-current source to divert a direct-current away from a direct-current load;
- opening an AC isolating switch between the direct-current source and the direct-current load while the direct-current is being diverted away from the direct-current load; and
- interrupting the short-circuit current at the output of the direct-current source after the AC isolating switch is opened,
- wherein a nominal current output of the direct current source exceeds a maximum switching current rating of the AC isolating switch.

9. The circuit arrangement as set forth in claim 1, a nominal current output of the direct current source exceeds a maximum switching current rating of the AC isolating switch.

* * * * *